(12) United States Patent
Chang-Chien et al.

(10) Patent No.: US 7,067,397 B1
(45) Date of Patent: Jun. 27, 2006

(54) METHOD OF FABRICATING HIGH YIELD WAFER LEVEL PACKAGES INTEGRATING MMIC AND MEMS COMPONENTS

(75) Inventors: Patty P. Chang-Chien, Redondo Beach, CA (US); Kelly J. Tomquist, Torrance, CA (US); Craig B. Geiger, Downey, CA (US); Alvin M. Kong, Manhattan Beach, CA (US)

(73) Assignee: Northrop Gruman Corp., Los Angeles, CA (US)

( * ) Notice: Subject to any disclaimer, the term of this patent is extended or adjusted under 35 U.S.C. 154(b) by 0 days.

(21) Appl. No.: 11/159,473

(22) Filed: Jun. 23, 2005

(51) Int. Cl.
*H01L 21/30* (2006.01)

(52) U.S. Cl. .................. 438/459; 438/106; 438/121

(58) Field of Classification Search .................. 438/48, 438/459, 106, 121
See application file for complete search history.

(56) References Cited

U.S. PATENT DOCUMENTS

| | | | |
|---|---|---|---|
| 3,615,855 A * | 10/1971 | Smith ...................... 136/255 |
| 5,448,014 A | 9/1995 | Kong et al. |
| 6,297,072 B1 * | 10/2001 | Tilmans et al. ............. 438/106 |
| 6,323,550 B1 | 11/2001 | Martin et al. |
| 6,326,697 B1 | 12/2001 | Farnworth |
| 6,400,021 B1 | 6/2002 | Cho |
| 6,420,244 B1 | 7/2002 | Lee |
| 6,441,481 B1 | 8/2002 | Karpman |
| 6,455,353 B1 | 9/2002 | Lin |
| 6,465,280 B1 | 10/2002 | Martin et al. |
| 6,465,281 B1 | 10/2002 | Xu et al. |
| 6,534,340 B1 | 3/2003 | Karpman et al. |
| 6,534,341 B1 | 3/2003 | Farnworth |
| 6,555,417 B1 | 4/2003 | Spooner et al. |
| 6,597,066 B1 | 7/2003 | Farnworth et al. |
| 6,621,158 B1 | 9/2003 | Martin et al. |
| 6,635,509 B1 * | 10/2003 | Ouellet ....................... 438/106 |
| 6,710,461 B1 | 3/2004 | Chou et al. |
| 6,777,263 B1 | 8/2004 | Gan et al. |
| 2003/0173017 A1 * | 9/2003 | Hecht et al. ................. 156/154 |

OTHER PUBLICATIONS

Sovero E A, Mihailovich R, Deakin D S, Higgins J A, Yao J J, DeNatale J F and Hong J H Monolithic GaAs PHEMT MMIC's integrated with high performance MEMS microrelays Proc. IMOC '99, Rio de Janeiro, Brazil (Aug. 9-12, 1999).*

* cited by examiner

*Primary Examiner*—W. David Coleman
*Assistant Examiner*—Jarrett Stark
(74) *Attorney, Agent, or Firm*—Carmen B. Patti & Assoc.

(57) ABSTRACT

Monolithic microwave integrated circuit (MMIC) components and micro electromechanical systems (MEMS) components are integrated onto a single substrate at a wafer scale, by first performing MMIC and MEMS fabrication on a front face of a thick substrate wafer, bonding the substrate wafer to a cover wafer, thinning the back face of the substrate wafer and, finally, completing MMIC and MEMS fabrication on the back face of the thinned substrate wafer. The fabrication process is facilitated by use of a guard ring between the wafers to provide additional mechanical support to the substrate wafer and to protect the devices while the MMIC/MEMS fabrication is completed, and by a low temperature bonding process to join the substrate wafer and the cover wafer at multiple device cavity seal rings.

20 Claims, 4 Drawing Sheets

METHOD OF FABRICATING HIGH YIELD WAFER LEVEL PACKAGES INTEGRATING MMIC AND MEMS COMPONENTS

This invention was made with Government support under contract number DAAD17-02-D-0002 awarded by the United States Army. The Government has certain rights in this invention.

BACKGROUND OF THE INVENTION

This invention relates generally to integrated circuit fabrication techniques and, more particularly, to methods for integrating monolithic microwave integrated circuit (MMIC) and micro electromechanical systems (MEMS) components into a single package. MMIC technology necessitates the use of an extremely thin substrate, in the range of 50–100 μm, and a MEMS device necessarily has significant thickness because it is basically a three-dimensional device. Moreover, MEMS devices cannot operate reliably in the field without hermetic packaging.

Integration of MEMS devices, such as radio frequency (RF) MEMS switches, with MMIC technology offers significant system performance improvements, such as low loss, high linearity and added functionality, in many space and military applications, especially those operating at very high frequencies, e.g., approaching 500 GHz (gigahertz) and above. There are, however, practical difficulties inherent in combining the two technologies. MMIC components are formed in one face of a very thin substrate and employ conductive vias to make connections through the "back" face of the substrate, while MEMS devices are preferably formed in a three-dimensional, hermetically sealed cavity, which dictates the use of a mechanically sturdy package. Reconciling the needs of MMIC components with those of MEMS components in an integrated package is one important goal of the present invention. A related goal is to achieve cost savings of the type normally associated with wafer-level fabrication and packaging of integrated circuitry, but in this case rendered very difficult to achieve by the thin substrate structure of MMIC components.

SUMMARY OF THE INVENTION

The present invention resides in a technique for integrating MMIC (monolithic microwave integrated circuit) technology with MEMS (micro electromechanical systems) technology in a double-wafer structure. Briefly, and in general terms, the method of the invention comprises the steps of providing a substrate wafer having a front face and a back face, and providing a cover wafer of comparable size to the substrate wafer; fabricating multiple MMIC and MEMS components on the front face of the substrate wafer; forming a first set of seal rings around selected device areas on the front face of the substrate wafer; forming a second set of seal rings on a surface of the cover wafer, in positions corresponding the first set of seal rings; and then bonding the first and second sets of seal rings to provide a double-wafer structure that includes multiple device cavities formed between the substrate wafer and the cover wafer. The ensuing steps include thinning the substrate wafer by removing material from its back face; and completing the MMIC and MEMS fabrication on the back face of the thinned substrate wafer. Integration of MMIC and MEMS components provides enhanced circuit performance for each fabricated device.

Preferably, the thinning step comprises lapping and polishing steps. Also preferably, the method further comprises the steps of mounting the double-wafer structure on a dummy carrier, by adhering the cover wafer to the dummy carrier prior to performing the thinning step; and subsequently removing the double-wafer structure from the dummy carrier after completing the MMIC and MEMS fabrication.

In accordance with one important aspect of the invention, the method further comprises forming a continuous guard ring surrounding the multiple device cavities in the double-wafer structure. More specifically the step of forming a continuous guard ring comprises forming one component of the guard ring on the cover wafer and another component on the front face of the substrate wafer, and then bonding the guard ring components together, simultaneously with the step of bonding the first and second sets of seal rings together. The continuous guard ring provides mechanical support to the substrate wafer during the thinning step, resulting in high production yields, and protects the MMIC and MEMS components during processing steps performed in completing the MMIC and MEMS fabrication.

The continuous guard ring may be circular, rectangular or of irregular shape, or it may occupy the entire space between the substrate wafer and the cover wafer except for spaces occupied by the multiple device cavities.

Another important aspect of the invention is embodied in a method for bonding substrates together. In particular, this method is defined by the steps of forming a first set of seal rings around selected areas on a face of a first wafer, wherein the step of forming the first set of seal rings comprises forming a first cavity spacer layer in the selected areas, and forming a gold layer over the first cavity spacer layer; and forming a second set of seal rings on a face of the second wafer, in positions corresponding the first set of seal rings. Once again, the step of forming the second set of seal rings comprises forming a second cavity spacer layer in the selected areas, and forming a gold layer over the second cavity spacer layer. The method further comprises forming an indium layer over one of the gold layers formed in the first and second sets of seal rings; heat treating the first and second sets of seal rings to begin melting the indium layer; and then forcing the first and second sets of seal rings together to intermix the indium layer with the adjacent gold layers and to form a bonded structure that seals each of the areas defined by the sets of seal rings. The forcing step may comprise alternately applying and releasing a compressive force multiple times, and the method further comprises subsequently cooling the first and second sets of seal rings.

In the disclosed embodiment of the invention, each of the first and second cavity spacer layers comprises multiple metal sublayers, at least one of which acts as a barrier to intermixing of indium into the cavity spacer layers. Specifically, each of the first and second cavity spacer layers comprises sublayers of titanium, platinum, and gold.

It will be appreciated from the foregoing summary that the present invention represents a significant advance in the field of fabrication of devices that ideally include MMIC and MEMS components in close integration. Other aspects and advantages of the invention will become apparent from the following more detailed description, taken in conjunction with the accompanying drawings.

DETAILED DESCRIPTION OF THE INVENTION

Figure 1A:
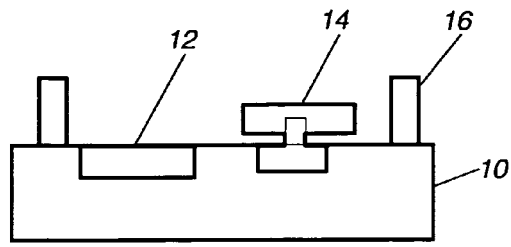
FIGS. 1A–1F are cross-sectional views that together depict a process for fabrication of wafer-level packages that integrate MEMS and MMIC components in multiple device cavities, only one of which is shown.

As shown in the drawings for purposes of illustration, the present invention concerns a process for wafer-level fabrication of circuitry that integrates MMIC (monolithic microwave integrated circuit) technology and MEMS (micro electromechanical systems) components. Although significant performance benefits can be achieved by this integration of technologies, differences in their fabrication and packing requirements have made this goal an elusive one for designers. One difficulty in particular is that production yields are rendered extremely low because of the required thinness of a MMIC substrate and a resultant tendency of the substrate to crack or break during wafer-level fabrications steps.

In accordance with the present invention, MMIC and MEMS components are integrated into a double-wafer structure that overcomes the foregoing difficulties. The principles of the fabrication process are shown in diagrammatic form in FIGS. 1A–1F. In particular, FIG. 1A shows the cross section of a portion of a MEMS/MMIC wafer, indicated by reference numeral 10. The first step of the process is to fabricate on the "front" side of the wafer 10 one or more MMIC components, depicted by the rectangle 12, and one or more MEMS components, illustrated by the irregular outline 14. The MEMS component 14, which may be a radio-frequency (RF) switch, in general includes a portion recessed into the substrate 10 and a portion extending above the substrate. Moreover, the MEMS component 14 is preferably enclosed in a hermetically sealed cavity. To this end, the structure of FIG. 1A further includes a seal ring, one component of which is shown at 16. FIG. 1B shows the cross-section of a cover substrate 20, which also includes a seal ring component 22. When the seal ring components 16 and 22 are bonded together, using a process to be described below in more detail, a double-wafer structure results, as shown in FIG. 1C, and a cavity 24 is formed between the substrates 10 and 20.

Figure 1D:
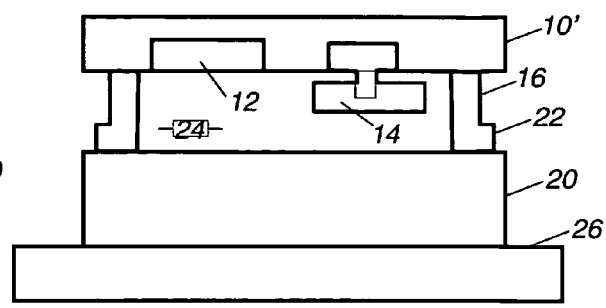
Figure 1B:
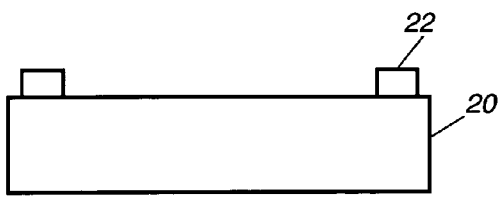
Figure 1E:
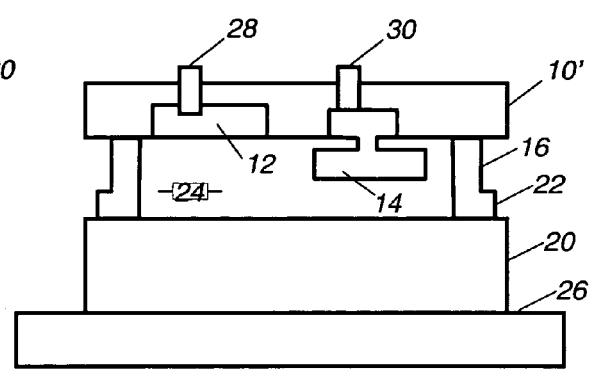
Figure 1C:
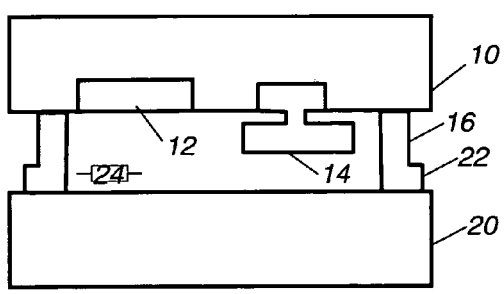

A critical ensuing step is thinning the wafer 10 of FIG. 1C, after first mounting the double-wafer structure to a dummy carrier 26 by the cover wafer 20, to produce the significantly thinned wafer 10' depicted in FIG. 1D. A combination of lapping, polishing and etching steps may be employed to thin the wafer 10. For example, the wafer 10 may be approximately 750 μm thick in FIG. 1C at the start of the thinning step. An initial lapping step may be initially used to reduce the thickness to approximately 160 μm. Lapping is essentially a process of removing material from a surface by use of a lapping tool (or by hand) and an abrasive material, usually suspended in a liquid. After lapping, a mechanical polishing step may be used, further reducing the thickness to approximately 150 μm. Finally, a chemical etching step reduces the wafer thickness further to approximately 100 μm or less, depending on the requirements of MMIC fabrication. The thinning step may alternatively include grinding material from the wafer 10. More generally, the thinning step includes any combination of process steps that remove material from and maintain the flatness of the "back" face of the substrate wafer.

Figure 1F:
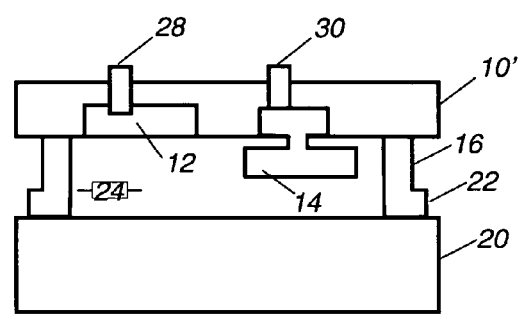

After thinning the wafer 10 to produce the thinned wafer 10', various conventional "backside" processing steps are performed, as shown in FIG. 1E, to make electrical connections to the MMIC components 12 and the MEMS components 14 through backside vias 28 and 30, formed in the wafer 10'. Finally, as shown in FIG. 1F, the dummy carrier 26 is removed, leaving the desired double-wafer structure, with integrated MMIC and MEMS components 12 and 14 and a hermetically sealed cavity 24.

Figure 2:
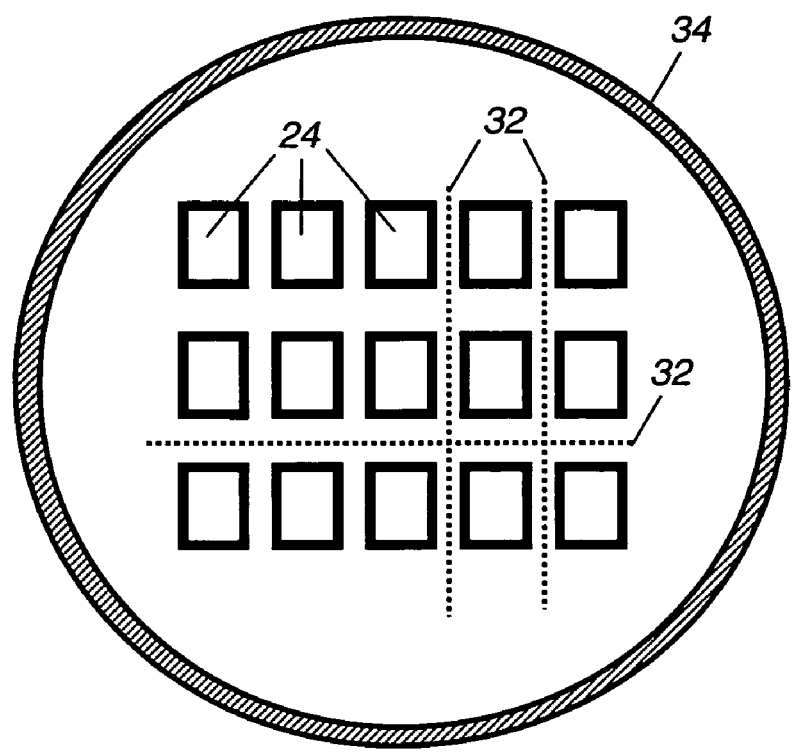
FIG. 2 is a diagrammatic top view of a MEMS/MMIC wafer such as the one shown in FIG. 1A.
Figure 3:
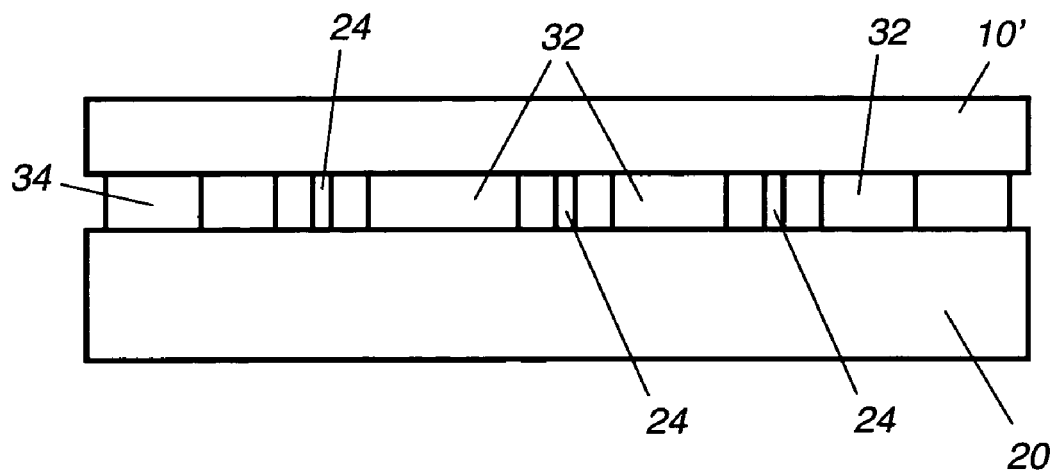
FIG. 3 is a diagrammatic cross-sectional view similar FIG. 1E, illustrating (with FIG. 2) a guard ring concept utilized in the fabrication process.

It will be understood that, for purposes of illustration, the processing steps of FIGS. 1A–1E are depicted for devices located in or adjacent to a single cavity 24, but it will also be understood that wafer-level packaging involves the simultaneous fabrication of a large array of such cavities and associated MEMS/MMIC components. By way of further illustration, FIG. 2 shows the top view of a MEMS/MMIC wafer 10 on which multiple cavities 24 are formed. Substrates at the wafer level are typically circular in shape, as shown, and the multiple device cavities 24 are arrayed on a rectangular grid, separated by spaces that may be referred to as "streets" 32. As best illustrated in FIG. 3, the streets 32 are typically much wider than the device cavities 24. When the wafer-level structure is subsequently diced into separate devices, the dicing saw (not shown) is typically much thicker than the width of each device cavity 24, and consequently most of the material in the streets 32 is eliminated in the dicing process.

FIGS. 2 and 3 also illustrate the use of a guard ring 34 as an important aid to fabrication at the wafer level. As shown in FIG. 2, the guard ring 34 may be circular, with a diameter sufficient to encompass all the device cavities 24 formed between the wafer substrates 10 and 20. The guard ring 34 performs two important functions in the fabrication process. First, the presence of the guard ring 34 near the periphery of the wafers 10 and 20 greatly facilitates thinning of the wafer 10 without distortion or breakage or the wafer. Without the guard ring 34, distortion or breakage of the wafer 10, including possible edge breakage, crack propagation and wafer separation, would result in very low production yields. The guard ring 34 provides added physical bonding strength and mechanical support for the substrate wafer 10 in the thinning process, and results in very high production yields. A second function of the ring guard 34 is to protect MMIC and MEMS components within the device cavities 24 during backside processing of the thinned wafer 10'. Without the guard ring 34, backside processing can expose the devices, or at least their seal rings, to chemical substances used in wet processing steps.

Figure 4:
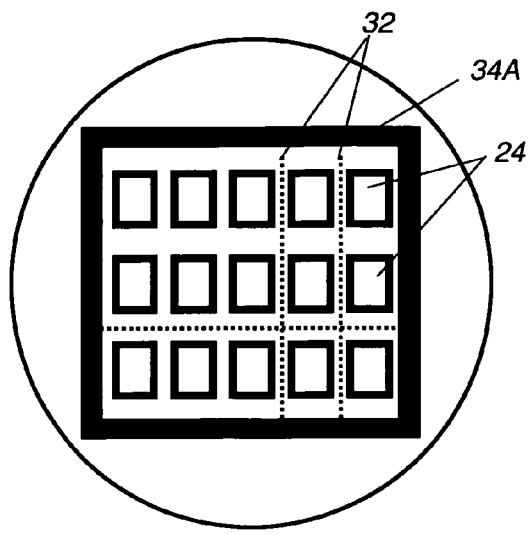
FIGS. 4, 5 and 6 are diagrammatic top views similar to FIG. 2, depicting alternate configurations of the guard ring concept.
Figure 5:
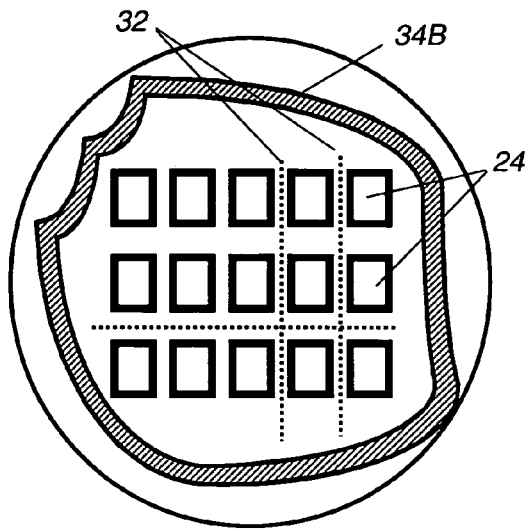
Figure 6:
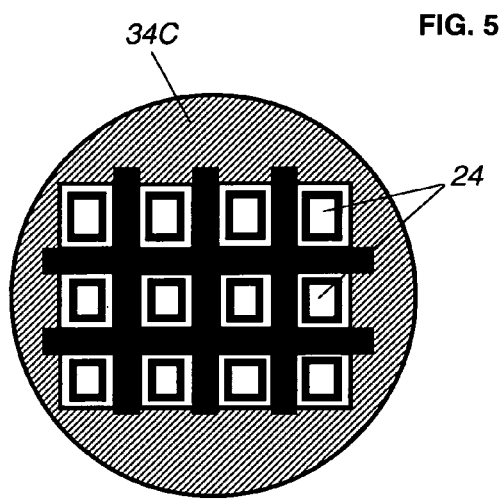
Figure 7:
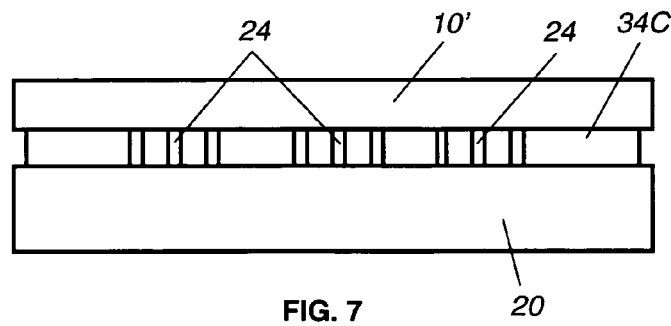
FIG. 7 is a diagrammatic cross-sectional view similar to FIG. 3, but corresponding to the guard ring concept depicted in FIG. 6.

FIGS. 4–7 illustrate alternate shapes of the guard ring 34. FIG. 4 shows that the guard ring 34A need not be circular and may, for example, have a rectangular shape that encompasses a rectangular array of device cavities 24. In FIG. 5, the guard ring 34B is of irregular shape. In FIG. 6, and as further clarified in FIG. 7, the guard ring 34C fills all the unused cavity space not occupied by the cavities 24. In general, then, the guard ring 34 may assume any closed configuration that serves to provide mechanical support for the substrate wafer 10 during the thinning step and to protect the cavities during MEMS/MMIC backside processing.

Low-temperature bonding is achieved by intermixing indium (In) and gold (Au) into an InAu alloy. The process uses a combination of a cold weld property of In and heat treatment for alloy formation, to achieve a hermetic seal. Typical bonding temperatures are between 175° C. and 240° C. but are for the most part at the lower end of this range.

Figure 8A:
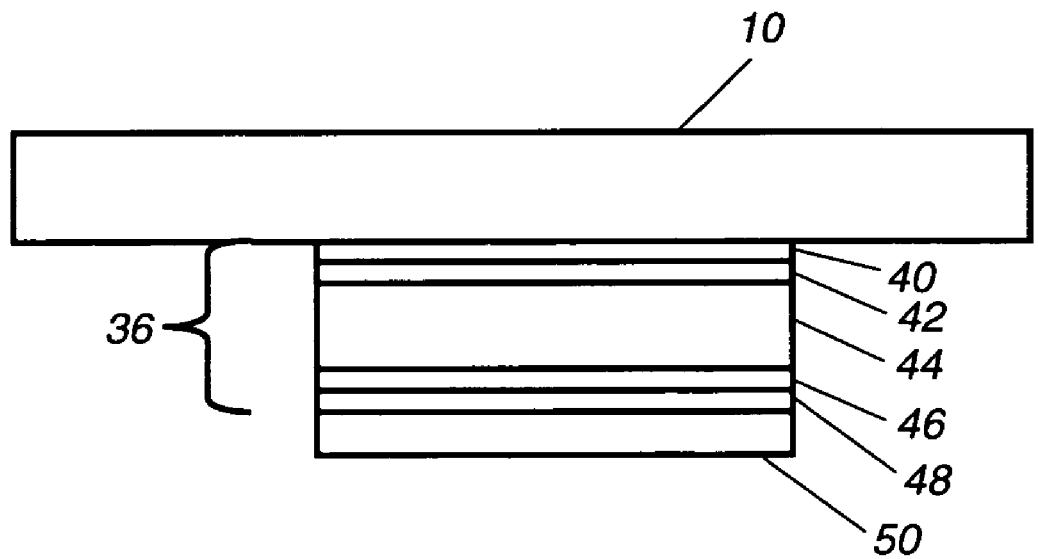
FIGS. 8A and 8B are more detailed cross-sectional views of seal ring stacks that were shown in simplified form in FIGS. 1A–1F, where FIG. 8A pertains to the a MEMS/MMIC wafer and FIG. 8B pertains to a cover wafer.
Figure 8B:
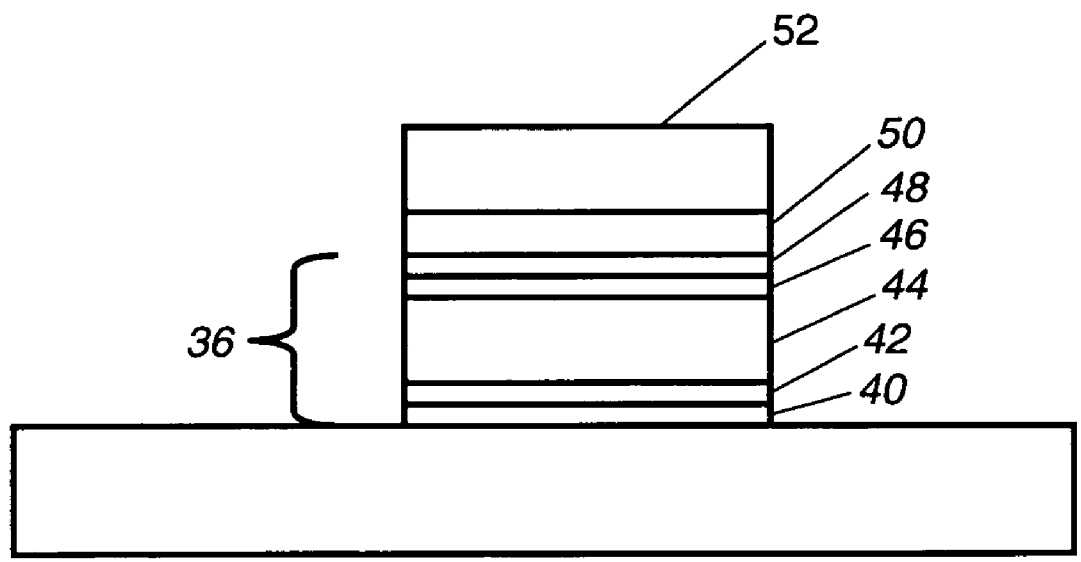

As shown in FIGS. 8A and 8B, both seals 16 and 22 include a cavity spacer 36 comprising a first layer 40 of titanium (Ti), a first layer 42 of platinum (Pt), a thicker layer 44 of gold (Au), a second layer 46 of Ti, and a second layer 48 of Pt. On the MEMS/MMIC substrate wafer 10, which may be of gallium arsenide (GaAs), the cavity spacer 36 is surmounted by another layer 50 of gold (Au). On the cover wafer 20, which may also be of GaAs, the cavity spacer 36 is also surmounted by another layer 50 of gold (Au), on which is formed a layer 52 of indium (In).

Before the bonding process begins, the two wafers 10 and 20 are heat treated to 175° C. The indium layer 52 melts at 156° C. and begins intermixing with the gold layer 50 beneath it. At this point in the process, the two seal stacks are brought together with the application of force, such as 3,000 N (newtons), which results in intermixing of the indium layer 52 with the gold layer 50 on the substrate wafer 10 stack. The compressive force on the bonding interface is then removed and reapplied to further "drive in" additional indium from layer 52 into the surrounding gold layers 50. This cyclic application of force is preferably repeated a few times before the bonded stack is cooled. The resulting In/Au alloy formed at the seal interface effectively seals the cavity 24 hermetically. The layers 48 and 46 of platinum and titanium, respectively, provide an effective barrier for further intermixing of indium into the cavity spacer layers 36.

It will be appreciated from the foregoing that the present invention provides significant advantages over prior art techniques for packaging MEMS and MMIC components. First, the invention provides a performance advantage with the ability to combine MEMS and MMIC components in the same device package. More specifically, active MMIC components can be integrated with low loss RF MEMS switches to provide added functionality at frequencies of around 50 GHz and higher. The added functionality includes the ability to implement, for example, tunable filters and tunable passive components. Another performance advantage is that the packaging technique of the invention inherently improves MEMS switch reliability and enables MEMS component insertion into RF systems, which is especially critical for systems requiring high linearity, high RF isolation and low insertion loss at high frequencies.

A second principal advantage of the invention lies in cost reduction. The wafer-level packaging technique of the invention utilizes parallel processes that produce a large number of packaged chips in one fabrication pass. At a subsystem level, wafer-level packaging eliminates the need for higher-level package assemblies, which are typically labor intensive and costly, because larger and more complex MEMS/MMIC configurations can be fabricated without the need for higher-level packaging. Cost savings at a system level are also achieved because all of the packages fabricated in accordance with the invention are extremely light and compact, resulting in significant weight and size savings to the entire system. Weight and size are critical in many applications, such as in spacecraft.

It will also be appreciated that, although several specific embodiments of the invention have been illustrated and described, various modifications may be made without departing from the spirit and scope of the invention. Accordingly, the invention should be limited except as by the appended claims.

The invention claimed is:

1. A method for fabricating wafer-level packages containing MMIC (monolithic microwave integrated circuit) components and MEMS (micro electromechanical systems) components, the method comprising the steps of:
   providing a substrate wafer having a front face and a back face, and providing a cover wafer of comparable size to the substrate wafer;
   fabricating multiple MMIC and MEMS components on the front face of the substrate wafer;
   forming a first set of seal rings around selected device areas on the front face of the substrate wafer;
   forming a second set of seal rings on a surface of the cover wafer, in positions corresponding the first set of seal rings;
   bonding the first and second sets of seal rings to provide a double-wafer structure that includes multiple device cavities formed between the substrate wafer and the cover wafer;
   thinning the substrate wafer by removing material from the back face; and
   completing MMIC and MEMS fabrication on the back face of the substrate wafer;
   whereby integration of MMIC and MEMS components provides enhanced circuit performance for each fabricated device.

2. A method as defined in claim 1, wherein the thinning step comprises lapping and polishing.

3. A method as defined in claim 1, and further comprising:
   mounting the double-wafer structure by adhering the cover wafer to a dummy carrier prior to performing the thinning step; and
   removing the double-wafer structure from the dummy carrier after completing MMIC and MEMS fabrication.

4. A method as defined in claim 1, and further comprising:
   dicing the double-wafer structure into multiple device chips.

5. A method as defined in claim 1, and further comprising:
   forming a continuous guard ring surrounding the multiple device cavities, wherein the step of forming a continuous guard ring comprises forming one component of the guard ring on the cover wafer and another component on the front face of the substrate wafer, and bonding the guard ring components together, simultaneously with the step of bonding the first and second sets of seal rings together;
   wherein the continuous guard ring provides mechanical support to the substrate wafer during the thinning step and protects the MMIC and MEMS components during the step of completing MMIC and MEMS fabrication.

6. A method as defined in claim 5, wherein the continuous guard ring is circular in shape and extends circumferentially about the double-wafer structure.

7. A method as defined in claim 5, wherein the continuous guard ring is rectangular in shape and encompasses the multiple device cavities.

8. A method as defined in claim 5, wherein the continuous guard ring is irregular in shape and encompasses the multiple device cavities.

9. A method as defined in claim 1, wherein:
   the step of forming a first set of seal rings comprises forming a first cavity spacer layer in selected regions of the front face of the substrate wafer and forming a gold layer over the first cavity spacer layer;

the step of for a second set of seal rings comprises a second cavity spacer layer in the selected regions of the face of the cover wafer forming a gold layer over the second cavity spacer layer;

one of the steps for forming first and second sets of seal rings Her comprises forming a layer of indium over the gold layer;

the bonding step comprises heat treating the first and second sets of seal rings to begin melting the indium layer, and forcing the first and second sets of seal rings together to intermix the indium layer with the gold layers and form a bonded structure that seals each of the multiple device cavities.

10. A method as defined in claim 9, wherein the bonding step further comprises;

applying and releasing compressive force multiple times to effect intermixing of indium and gold and to form an indium/gold alloy at each seal ring; and subsequently cooling the double-wafer structure.

11. A method for bonding first and second wafers together using relatively low processing temperatures, the method comprising:

forming a first set of seal rings around selected areas on a face of the first wafer, wherein the step of forming the first set of seal rings comprises forming a first cavity spacer layer in the selected areas, and forming a gold layer over the first cavity spacer layer;

forming a second set of seal rings on a face of the second wafer, in positions corresponding the first set of seal rings, wherein the step of forming the second set of seal rings comprises forming a second cavity spacer layer in the selected areas, and forming a gold layer over the second cavity spacer layer;

forming an indium layer over one of the gold layers formed in the first and second sets of seal rings;

heat treating the first and second sets of seal rings to begin melting the indium layer; and forcing the first and second sets of seal together to intermix the indium layer with the gold layers and to form a bonded structure that seals each of the areas defined by the sets of seal rings.

12. A method as defined in claim 11, wherein the forcing step comprises alternately applying and releasing a compressive force multiple times.

13. A method as defined in claim 12, and further comprising subsequently cooling the first and second sets of seal rings.

14. A method as defined in claim 11, wherein each of the first and second cavity spacer layers comprises multiple metal sublayers at least one of which acts as a barrier against intermixing of indium into the cavity spacer layers.

15. A method as defined in claim 14, wherein each of the first and second cavity spacer layers comprises sublayers of titanium, platinum, and gold.

16. A method as defined in claim 11, where the heat treating and bonding steps are performed at a selected temperature in the range of approximately 175° C. to 240° C.

17. A method as defined in claim 5, wherein, the continuous guard ring fills the entire space between the substrate wafer and the cover wafer except for spaces occupied by the multiple device cavities.

18. A method as defined in claim 5, wherein the continuous guard ring is located near a periphery of the substrate wafer to provide physical strength in addition to the first and second sets of seal rings;

wherein the continuous guard ring surrounds the multiple MMIC and MEMS components and the first and second sets of seal rings;

wherein the continuous guard ring serves to prevent exposure of the first and second sets of seal rings to chemical substances used in wet processing during the step of completing MMIC and MEMS fabrication.

19. A method as defined in claim 1, wherein the substrate wafer is thinned during the thinning step after the substrate wafer and the cover wafer have been bonded together during the bonding step.

20. A method as defined in claim 11, wherein each of the first and second cavity spacer layers comprises a titanium sublayer, a platinum sublayer, and a gold sublayer;

wherein the titanium and platinum sublayers serve to prevent intermixing interesting of the indium layer with the gold sublayer of the first and second cavity spacer layers.

* * * * *

UNITED STATES PATENT AND TRADEMARK OFFICE
CERTIFICATE OF CORRECTION

| | | |
|---|---|---|
| PATENT NO. | : 7,067,397 B1 | Page 1 of 1 |
| APPLICATION NO. | : 11/159473 | |
| DATED | : June 27, 2006 | |
| INVENTOR(S) | : Chang-Chien et al. | |

It is certified that error appears in the above-identified patent and that said Letters Patent is hereby corrected as shown below:

On Title Page Item (75)

Please delete the inventor name "Kelly J. Tomquist" as it is incorrectelly spelled;

and replace it with --Kelly J. Tornquist --

Signed and Sealed this

Twenty-eighth Day of November, 2006

JON W. DUDAS
*Director of the United States Patent and Trademark Office*